United States Patent [19]

Pfeifer et al.

[11] Patent Number: 4,764,584
[45] Date of Patent: Aug. 16, 1988

[54] RADIATION-SENSITIVE POLYCONDENSATES, THEIR PREPARATION, MATERIAL COATED THEREWITH AND THE USE THEREOF

[75] Inventors: Josef Pfeifer, Therwil; Rudolf Duthaler, Zurich, both of Switzerland

[73] Assignee: Ciba-Geigy Corporation, Ardsley, N.Y.

[21] Appl. No.: 99,373

[22] Filed: Sep. 11, 1987

Related U.S. Application Data

[62] Division of Ser. No. 845,084, Mar. 27, 1986, Pat. No. 4,714,669.

[30] Foreign Application Priority Data

Apr. 11, 1985 [CH] Switzerland ............ 1552/85

[51] Int. Cl.[4] ............ C08G 4/00; C08G 12/00
[52] U.S. Cl. ............ 528/220; 528/226; 528/228; 528/229
[58] Field of Search ............ 528/220, 226, 228, 229

[56] References Cited

U.S. PATENT DOCUMENTS 4,673,773  6/1987  Nakano et al. ............ 174/68.5
4,694,061  9/1987  Pfeifer ............ 528/125

Primary Examiner—Lucille M. Phynes
Attorney, Agent, or Firm—Luther A. R. Hall

[57] ABSTRACT

Homo- and copolycondensates selected from the group consisting of linear saturated polyamides, polyesters and polyester amides derived from dicarboxylic acids of formula IV

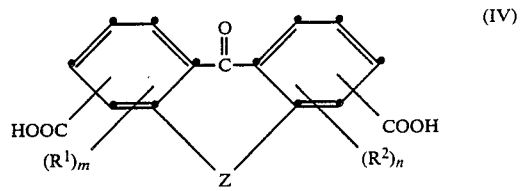

wherein Z is a direct bond, methylene, —O—, —S—, —SO—, —SO$_2$—, —CO—, —NH— or alkylidene, $R^1$ and $R^2$ are independently alkyl, halogen, cyano, nitro, alkoxy, phenoxy or benzyl, and m and n are independently 0 to 3, are radiation-sensitive and are particularly suitable for the production of protective coatings and relief images.

22 Claims, No Drawings

RADIATION-SENSITIVE POLYCONDENSATES, THEIR PREPARATION, MATERIAL COATED THEREWITH AND THE USE THEREOF

This is a divisional of application Ser. No. 845,084, filed on Mar. 27, 1986, now U.S. Pat. No. 4,714,669, issued on Dec. 22, 1987.

The present invention relates to radiation-sensitive linear saturated homo- and polycondensates selected from the group consisting of polyesters, polyamides and polyester amides, to a material coated with said polycondensates, and to the use thereof for producing protective coatings or photographic images.

It is known from U.S. Pat. No. 3,926,639 that polymers containing radicals of benzophenonecarboxylic acids are autophotopolymerisable or are suitable for use as photoinitiators for photopolymerisable compounds. In general, polyesters and polyamides are mentioned. As photopolymerisable groups, these polyesters and polyamides contain radicals of ethylenically unsaturated carboxylic acids and alcohols. The Examples further describe saturated and crosslinked polyesters which are obtained from tri- and tetrafunctional carboxylic acids and alcohols in admixture with dicarboxylic acids and diols. These polyesters are soft, tacky materials. Such materials are difficult to handle and their thermomechanical properties do not meet the requirements made of these materials in different fields of use.

The present invention relates to radiation-sensitive linear saturated homo- and polycondensates selected from the group of polyesters, polyamides and polyester amides and containing at least one recurring structural unit of formula I

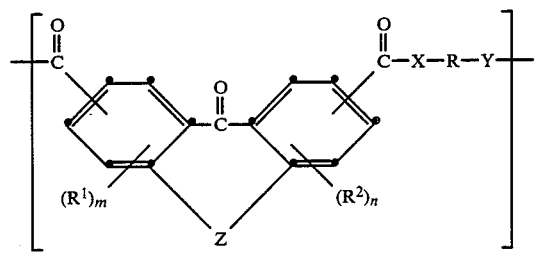

(I)

and, in the case of copolycondensates, also recurring structural units of formula II

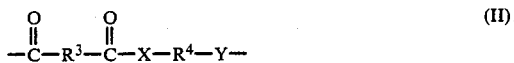

(II)

wherein
  m and n are each independently of the other an integer from 0 to 3,
  X and Y are each independently of the other —S—, —O— or —NR$^5$—,
  Z is a direct bond, —CH$_2$—, —O—, —S—, —SO—, —SO$_2$—, —CO—, —NR$^6$— or —CR$^6$R$^7$—, where R$^6$ is a hydrogen atom, C$_1$–C$_{10}$alkyl, phenyl, naphthyl or phenyl(C$_a$H$_{2a}$), where a is 1 to 4, and R$^7$ has the same meaning as R$^6$ but is not a hydrogen atom,
  R$^1$ and R$^2$ are each independently of the other C$_1$–C$_{10}$alkyl, halogen, —CN, —NO$_2$, C$_1$–C$_{12}$alkoxy, phenoxy, naphthoxy or phenyl(C$_a$H$_{2a}$), wherein a is 1 to 4,
  R is an unsubstituted or substituted divalent aliphatic, cycloaliphatic, araliphatic or aromatic radical, and, if X and Y are the —NR$^5$— group, R and one of R$^5$, when taken together, are C$_5$–C$_7$alkylene to which the second —NR$^5$— group is attached, or R is methylene, ethylene or propylene, and both radicals R$^5$ of the —NR$_5$—groups, when taken together, are ethylene or propylene or, if one of X or Y is —S— or —O— and the other is —NR$^5$—, R and R$^5$ together are C$_5$–C$_7$alkylene,
  R$^4$ has independently the same meaning as R,
  R$^3$ is a divalent saturated aliphatic or aromatic radical, and
  R$^5$ is a hydrogen atom, alkyl, cycloalkyl, aryl, aralkyl or alkaralkyl,
  said copolycondensates containing at least 10 mol.% of the structural units of formula I, based on the copolycondensate.

In formulae I and II, X and Y preferably have the same meaning and are suitably an —NR$^5$— group or —O—.

The polycondensates contain preferably at least 50 mol.%, in particular at least 70 mol.% and, most preferably, at least 90 mol.%, of the structural units of formula I. The amount depends essentially on the desired radiation sensitivity of the polycondensates.

In formula I, m and n are preferably 1 and, most preferably, 0. R$^1$ and R$^2$ are each independently of the other preferably alkyl or alkoxy of 1 to 4 carbon atoms, most preferably methyl, ethyl or methoxy, or halogen, preferably Br or Cl.

R$^5$ as linear or branched alkyl contains preferably 1 to 6 carbon atoms and, as cycloalkyl, contains 5 to 7 ring carbon atoms and may be cyclopentyl, cyclohexyl or methylcyclohexyl. Aryl radicals R$^5$ are preferably phenyl radicals, e.g. phenyl, methylphenyl or benzyl. Most preferably, R$^5$ is a hydrogen atom.

The carbonyl groups in the structural unit of formula I are preferably located meta and, most preferably, para to the carbonyl group in the ring.

Divalent aliphatic radicals R and R$^4$ in formulae I and II preferably contain 2 to 30 carbon atoms. In particular, the radicals R and R$^4$ contain 6 to 30 and, most preferably, 6 to 20, carbon atoms, if X and Y are the —NR$^5$— group. If X and Y in formulae I and II are —S— or —O—, the aliphatic radical preferably contains 2 to 20, most preferably 2 to 12, carbon atoms. In a preferred sub-group, R and R$^4$ are linear or branched alkylene which may be interrupted in the chain by oxygen atoms, NH, NR$^a$, ⊕NR$_2^a$G⊖, cyclopentylene, cyclohexylene, naphthylene, phenylene or hydantoin radicals. R$^a$ may be for example alkyl of 1 to 12 carbon atoms, cycloalkyl of 5 or 6 ring carbon atoms, phenyl or benzyl. G⊖ is an anion of a protic acid, for example halide, sulfate or phosphate. In a further preferred embodiment, R is linear or branched alkylene, —(CH$_2$)$_x$—R$^8$—(CH$_2$)$_y$—, wherein R$^8$ is phenylene, naphthylene, cyclopentylene or cyclohexylene and x and y are each independently of the other 1, 2 or 3, —R$^9$—(OR$^{10}$)$_p$O—R$^9$—, in which R$^9$ is ethylene, 1,2-propylene, 1,3-propylene or 2-methyl-1,3-propylene, R$^{10}$ is ethylene, 1,2-propylene, 1,2-butylene, 1,3-propylene or 1,4-butylene and p is an integer from 1 to 100, or

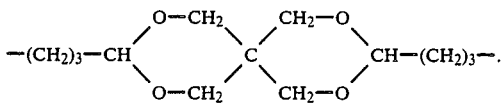

Examples of aliphatic radicals are: ethylene, 1,2- or 1,3-propylene, 2,2-dimethyl-1,3-propylene, 1,2-, 1,3- or 1,4-butylene, 1,3- or 1,5-pentylene, the hexylenes, heptylenes, octylenes, decylenes, dodecylenes, tetradecylenes, hexadecylenes, octadecylenes, eicosylenes, 2,4,4-trimethylhexylene, 1,10-dialkyldecylene, in which the alkyl preferably contains 1 to 6 carbon atoms, substituted 1,11-undecylenes, for example those described in European patent application B-0 011 559, jeffamines, for example

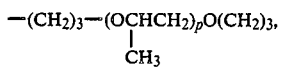

in which p is 1 to 100, or $-(CH_2)_3(O(CH_2)_4)_pO-(CH_2)_3-$ in which p is 1-100, dimethylenecyclohexane, xylylene and diethylenebenzene. R or $R^4$ are most preferably branched alkylene containing e.g. 8 to 30 carbon atoms in the chain if X and Y in formulae I and II are $-NR^5-$ groups.

If X and Y in formulae I and II are $-O-$ or $-S-$, then R and $R^4$ are preferably linear alkyl of 2 to 12, most preferably of 2 to 6, carbon atoms.

Aliphatic radicals interrupted by heterocyclic radicals may be e.g. those derived from N,N'-aminoalkylated or N,N'-hydroxyalkylated hydantoins or benzimidazoles. Examples are N,N'-(γ-aminopropyl)-5,5-dimethylhydantoin or N,N'-(γ-aminopropyl)-benzimidazolones, and those of the formula

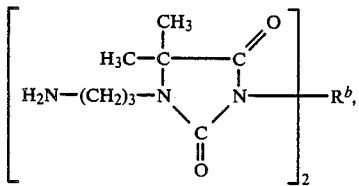

in which $R^b$ is alkylene of 1 to 12, preferably 1 to 4, carbon atoms or

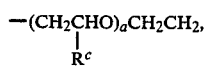

in which $R^c$ is a hydrogen atom or methyl and a is an integer from 1 to 20.

Examples of corresponding diols are N,N'-(β-hydroxyethyl)-5,5-dimethylhydantoin, N,N'-(β-hydroxyethyl)benzimidazolone and N,N'-(β-hydroxyethyl)-4,5,6,7-tetrabromobenzimidazolone.

Examples of suitable substituents of the aliphatic radicals are halogens such as F or Cl, and alkyl or alkoxy, each of 1 to 6 carbon atoms.

A divalent cycloaliphatic radical R or $R^4$ in formulae I and II preferably contains 5 to 8 ring carbon atoms and is, in particular, mononuclear or binuclear cycloalkylene which has 5 to 7 ring carbon atoms and is unsubstituted or substituted by alkyl which preferably contains 1 to 4 carbon atoms. In a preferred embodiment, a cycloaliphatic radical R or $R^4$ is one of the formula

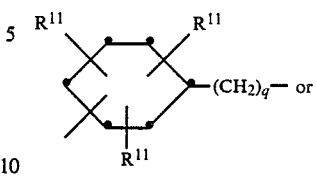

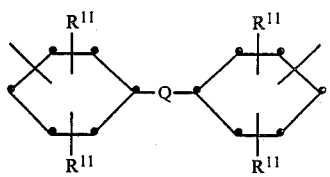

wherein q is 0 or 1, each $R^{11}$ independently is hydrogen or alkyl of 1 to 6 carbon atoms and Q is a direct bond, O, S, SO$_2$, alkylene of 1 to 3 carbon atoms or alkylidene of 2 to 6 carbon atoms. $R^{11}$ is preferably ethyl or methyl, Q is preferably methylene and the alkylidene radical preferably contains 2 or 3 carbon atoms and is, for example, ethylidene or 1,1- or 2,2-propylidene.

Examples of a cycloalkylene radical R or $R^4$ are typically: 1,2- or 1,3-cyclopentylene, 1,2-, 1,3- or 1,4-cyclohexylene, cycloheptylene, cyclooctylene, methylcyclopentylene, methyl- or dimethylcyclohexylene, 3- or 4-methylcyclohex-1-yl, 5-methyl-3-methylenecyclohex-1-yl, 3,3'- or 4,4'-biscyclohexylene, 3,3'-dimethyl-4,4'-biscyclohexylene, 4,4'-biscyclohexylene ether, 4,4'-biscyclohexylenesulfone, 4,4'-biscyclohexylenemethane or 4,4'-biscyclohexylene-2,2-propane, as well as the divalent radicals of bisaminomethyltricyclodecane, bisaminomethylnorborane and methanediamine.

A particularly preferred divalent cycloaliphatic radical R or $R^4$ is 1,4- or 1,3-cyclohexylene, methylenebis(cyclohex-4-yl) or methylenebis(3-methylcyclohex-4-yl).

An araliphatic radical R or $R^4$ preferably contains 7 to 30 carbon atoms. If, as is preferred, the aromatic group of the araliphatic radical is attached to the N-atoms in the radical of the formula I or II, these aromatic groups are preferably substituted in the same manner as an aromatic radical R or $R^4$, including the preferred substitutions. The araliphatic radical preferably contains 7 to 26, most preferably 8 to 22, carbon atoms. The aromatic moiety of the araliphatic radical is preferably a phenyl radical. An araliphatic radical R or $R^4$ is preferably aralkylene which is unsubstituted or substituted by alkyl in the aryl moiety, the alkylene radical being linear or branched. In a preferred embodiment, the araliphatic radical has the formula

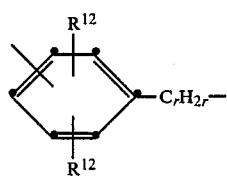

wherein each $R^{12}$ independently is a hydrogen atom or preferably $C_1-C_6$ alkyl, and r is an integer from 1 to 20. The free bond can be ortho, meta or preferably para to the $C_rH_{2r}$ group and one $R^{12}$ or each $R^{12}$ is preferably located ortho to the free bond. If X and Y are —O— or —S—, the araliphatic radical is preferably substituted.

Examples of a divalent araliphatic radical R or $R^4$ are typically: m- or p-benzylene, 3-methyl-p-benzylene, 3-ethyl-p-benzylene, 3,5-dimethyl-p-benzylene, 3,5-diethyl-p-benzylene, 3-methyl-5-ethyl-p-benzylene, p-phenylenepropylene, 3-methyl-p-phenylene-propylene, p-phenylenebutylene, 3-ethyl-p-phenylenepentylene and, in particular, longer-chain phenylenealkylene radicals of diamines, which are described e.g. in European patent application A-0 069 062: 6-(p-phenylene)-6-methylhept-2-yl, 6-(3'-methyl-p-phenylene)-6-methylhept-2-yl, 6-(3'-ethyl-p-phenylene)-6-methylhept-2-yl, 6-(3',5'-dimethyl-p-phenylene)-6-methylhept-2-yl, 11-(p-phenylene)-2,11-dimethyl-dodec-1-yl and 13-(p-phenylene)-2,12-dimethyltetradec-3-yl.

Particularly preferred homopolycondensates and copolycondensates are those containing structural units of formulae I and II in which R and $R^4$ are unsubstituted and, preferably, substituted, aromatic radicals and X and Y are the —$NH^5$— group. The substituent on the aromatic radical preferably contains 1 to 20, in particular 1 to 12 and most preferably 1 to 6, carbon atoms. The substituent is in particular linear or branched alkyl, alkoxy or alkoxyalkyl, each of 1 to 6 carbon atoms, benzyl, trimethylene or tetramethylene. Alkoxymethyl is the preferred alkoxyalkyl radical and methoxy is the preferred alkoxy radical. Examples of the substituent are: methyl, ethyl, propyl, isopropyl, n-butyl, isobutyl, pentyl, hexyl, octyl, dodecyl, tetradecyl, eicosyl, methoxy, ethoxy, propoxy, butoxy, pentoxy, hexoxy, methoxymethyl, methoxyethyl, ethoxymethyl, propoxymethyl, butoxymethyl, benzyl, methylbenzyl, and phenethyl. Preferred radicals are methoxymethyl, ethoxymethyl, methyl, ethyl, trimethylene and tetramethylene. Methyl and ethyl are particularly preferred. The aromatic radical can be a mononuclear or polynuclear radical, in particular a binuclear radical. Mononuclear radicals may contain 1 to 4, preferably 2 to 4 and most preferably 4, substituents, and binuclear radicals may contain 1 to 4, preferably 2, substituents in each nucleus. It has been found that the photosensitivity of homo- or copolycondensates is particularly high if one or preferably two substituents are located ortho to the X and/or Y group and X and Y are the —$NR^5$— group. Further, such polyamides have particularly good thermomechanical properties. Substitution in one or both of the ortho-positions is thus preferred. The aromatic radical is preferably located meta or para to the X and/or Y group. If X and Y are —O— or —S—, unsubstituted binuclear aromatic radicals are preferred.

An aromatic radicals R may contain 6 to 30, in particular 6 to 20, carbon atoms. The aromatic radical is preferably a hydrocarbon radical, in particular a mononuclear or binuclear phenylene radical, a naphthylene radical or a pyridine radical, which is substituted by alkyl, alkoxyalkyl, alkoxy, trimethylene or tetramethylene.

A preferred sub-group comprises those aromatic radicals of the formulae

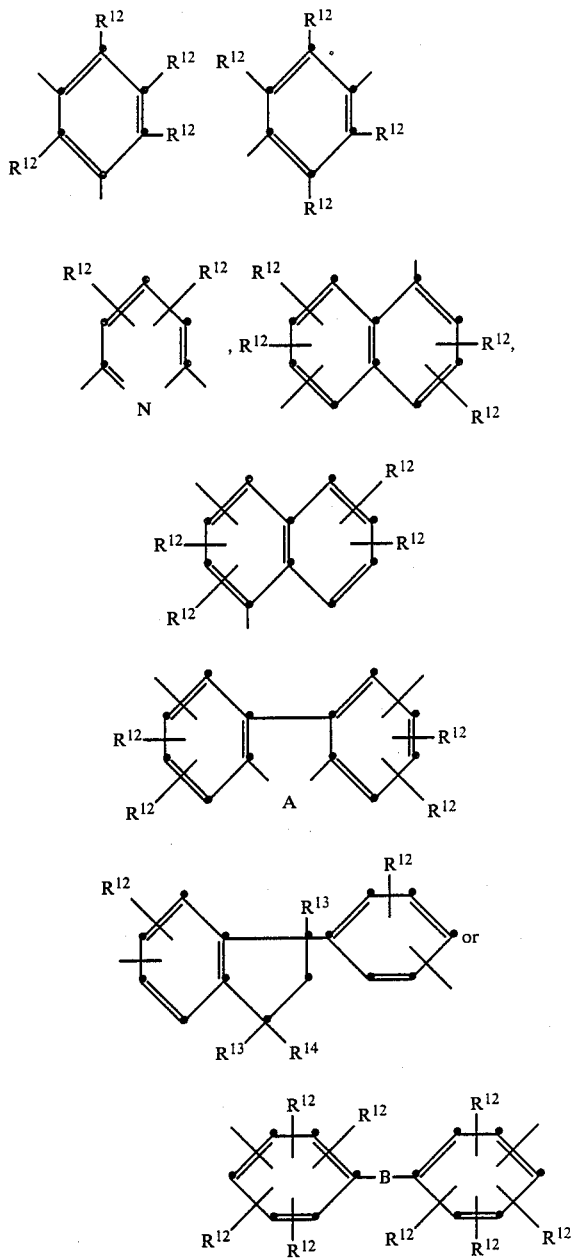

wherein each $R^{12}$ is a hydrogen atom and, in the case of monosubstitution, one substituent $R^{12}$ is alkyl of 1 to 6 carbon atoms and the other substituents $R^{12}$ are hydrogen atoms, and in the case of di-, tri- or tetra-substitution, two substituents $R^{12}$ are alkyl of 1 to 6 carbon atoms and the other substituents $R^{12}$ are hydrogen atoms or alkyl of 1 to 6 carbon atoms, or in the case of di-, tri- or tetra-substitution, two vicinal substituents $R^{12}$ in the phenyl ring are trimethylene or tetramethylene and the other substituents $R^{12}$ in the phenyl ring are trimethylene or tetramethylene and the other substituents $R^{12}$ are hydrogen atoms or alkyl of 1 to 6 carbon atoms, A is O, S, NH, CO or $CH_2$, $R^{13}$ is a hydrogen atom or alkyl of 1 to 5 carbon atoms, $R^{14}$ is alkyl of 1 to 5 carbon atoms and B is a direct bond, O, S, SO, $SO_2$, CO,

NR[15], CONH, NH, R[15]SiR[16], R[15]OSiOR[16], alkylene of 1 to 6 carbon atoms, alkenylene or alkylidene of 2 to 6 carbon atoms, phenylene or phenyldioxyl, in which R[15] and R[16] are each independently of the other alkyl of 1 to 6 carbon atoms or phenyl. R[13] and R[14] are preferably methyl, A is preferably —CH₂— or —O— and B is preferably a direct bond, —O—, —CH₂— or alkylidene of 2 to 4 carbon atoms. R[15] and R[16] are preferably methyl, ethyl or phenyl. Alkylene preferably contains 2 to 4 carbon atoms and is in particular ethylene. Alkenylene is preferably ethenylene.

A preferred subgroup comprises toluylene radicals, radicals of o,o'-substituted diaminodiphenylenes, diaminodiphenylmethanes and diaminodiphenyl ethers.

A particularly preferred group comprises those aromatic radicals of the formulae

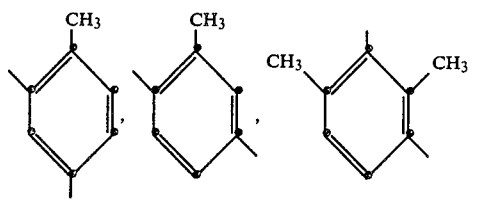

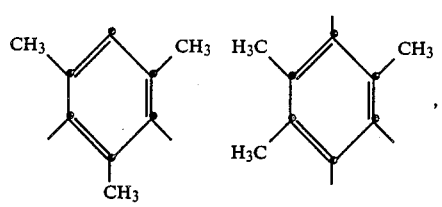

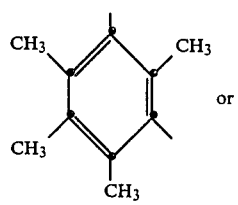

or

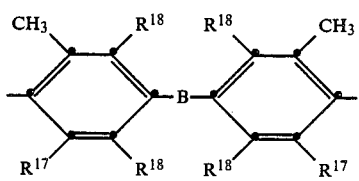

wherein B is a direct bond, —O— and preferably —CH₂—, and R[17] is a hydrogen atom and is preferably methyl or ethyl, and R[18] is a hydrogen atom or methyl or ethyl.

Examples of unsubstituted and substituted aromatic radicals are: 1,3- or 1,4-phenylene, 2,4- or 2,7-naphthylene, 4,4'-diphenylene, 4,4'-diphenylenemethane, 4,4'-diphenylene ether, 4-methyl-1,3-phenylene, 4-ethyl-1,3-phenylene, 2-methyl-1,3-phenylene, 4-benzyl-1,3-phenylene, 4-methoxymethyl-1,3-phenylene, tetrahydro-1,3- or -1,4-naphthylene, 3-propyl-1,3- or -1,4-phenylene, 3-isopropyl-1,4-phenylene, 3,5-dimethyl-1,4-phenylene, 2,4-dimethyl-1,3-phenylene, 2,3-dimethyl-1,4-phenylene, 5-methyl-1,3-phenylene, 2,3,5,6-tetramethyl-1,4- or -1,3-phenylene, 3-methyl-2,6-pyridylene, 3,5-dimethyl-2,6-pyridylene, 3-ethyl-2,6-pyridylene, 1-methyl-2,7-naphthylene, 1,6-dimethyl-2,7-naphthylene, 1-methyl-2,4-naphthylene, 1,3-dimethyl-2,4-naphthylene, the divalent radicals of 5-amino-1-(3'-amino-4'-methylphenyl)-1,3,3-trimethylindane or 6-amino-5-methyl-1-(3'-amino-4'-methyl)-1,3,3-trimethylindane, 4-methoxymethyl-1,3-phenylene, 3-methyl-p-diphenylene, 3-ethyl-p-diphenylene, 3,3'-dimethyl-p-diphenylene, 3,3'-diethyl-p-diphenylene, 3-methyl-3'-ethyl-p-diphenylene, 3,3',5,5'-tetramethyl-diphenylene, 3,3'-methyl-5,5'-ethyl-p-diphenylene, 4,4'-dimethyl-m-diphenylene, 3,3'-diisopropyldiphenylene and radicals of the formulae

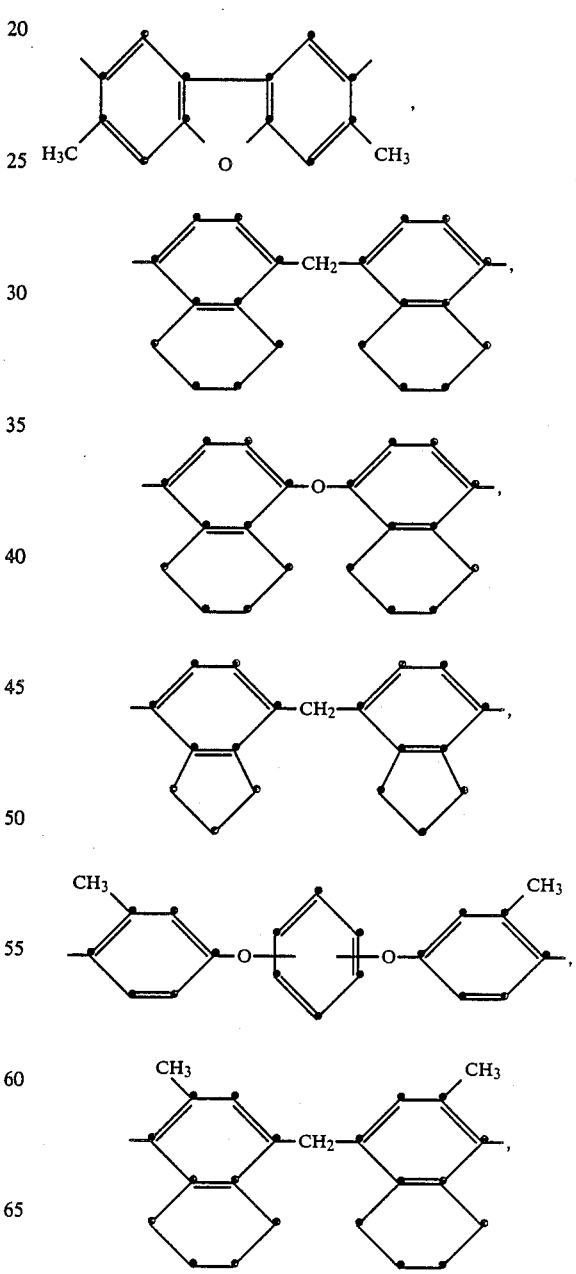

-continued

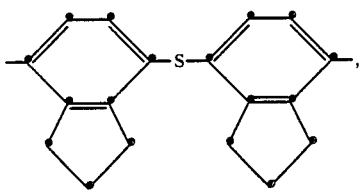

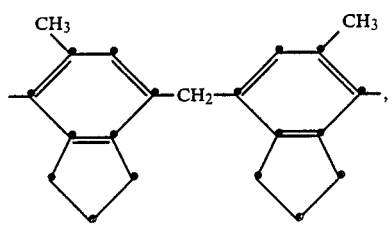

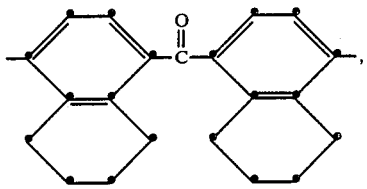

as well as

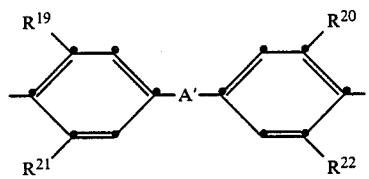

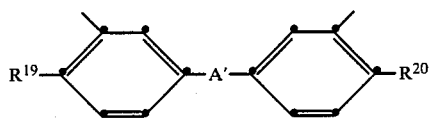

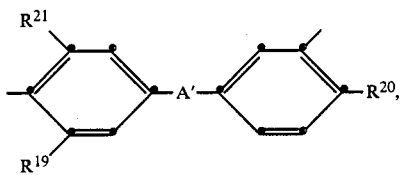

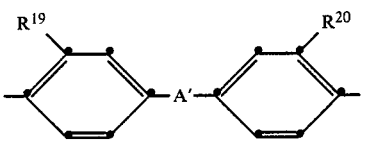

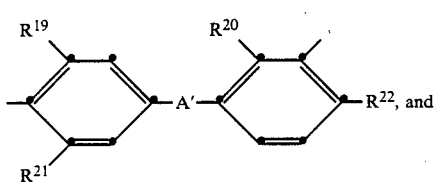, and

-continued

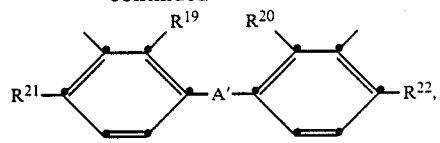

wherein A′, $R^{19}$, $R^{20}$, $R^{21}$ and $R^{22}$ have the meanings indicated in the following Table. The three tetrasubstituted radicals of the above formulae may be substituted in each nucleus by radicals G and/or H, where G and H have the meanings of $R^{19}$ to $R^{22}$.

| A′ | $R^{19}$ | $R^{20}$ | $R^{21}$ | $R^{22}$ |
|---|---|---|---|---|
| CH₂ | methyl | methyl | — | — |
| CH₂ | methyl | ethyl | — | — |
| CH₂ | ethyl | ethyl | — | — |
| CH₂ | isopropyl | isopropyl | — | — |
| CH₂ | methoxymethyl | | — | — |
| CH₂ | benzyl | benzyl | — | — |
| CH₂ | methyl | methyl | H | H |
| CH₂ | ethyl | ethyl | H | H |
| CH₂ | isopropyl | isopropyl | H | H |
| CH₂ | methoxymethyl | | H | H |
| CH₂ | methyl | ethyl | H | H |
| CH₂ | methoxymethyl | | methoxymethyl | |
| CH₂ | methyl | methyl | methyl | methyl |
| CH₂ | ethyl | ethyl | ethyl | ethyl |
| CH₂ | methyl | methyl | ethyl | ethyl |
| CH₂ | ethyl | ethyl | isopropyl | isopropyl |
| CH₂ | isopropyl | isopropyl | isopropyl | isopropyl |
| CH₂ | isopropyl | isopropyl | H | H |
| CH₂ | methoxy | methoxy | H | H |
| O | methyl | methyl | — | — |
| O | ethyl | ethyl | — | — |
| O | methyl | methyl | H | H |
| O | methyl | methyl | methyl | methyl |
| O | methyl | methyl | ethyl | ethyl |
| S | methyl | methyl | — | — |
| S | ethyl | ethyl | — | — |
| S | methyl | methyl | H | H |
| S | methyl | methyl | methyl | methyl |
| S | ethyl | ethyl | ethyl | ethyl |
| S | methyl | methyl | ethyl | ethyl |
| CO | methyl | methyl | — | — |
| CO | methyl | methyl | H | H |
| CO | methyl | methyl | methyl | methyl |
| SO₂ | methyl | methyl | — | — |
| SO₂ | methyl | methyl | H | H |
| SO₂ | methyl | methyl | methyl | methyl |
| SO₂ | ethyl | ethyl | methyl | methyl |
| SO | methyl | methyl | — | — |
| SO | methyl | methyl | H | H |
| COO | methyl | methyl | H | H |
| COO | methyl | methyl | methyl | methyl |
| CONCH₃ | methyl | methyl | H | H |
| NCH₃ | methyl | methyl | — | — |
| NCH₃ | methyl | methyl | methyl | methyl |
| CONH | methyl | methyl | — | — |
| NH | ethyl | ethyl | H | H |
| NH | methyl | methyl | — | — |
| Si(methyl)₂ | methyl | methyl | — | — |
| Si(phenyl)₂ | methyl | methyl | methyl | methyl |
| Si(Omethyl)₂ | ethyl | ethyl | — | — |
| Si(Ophenyl)₂ | methyl | methyl | H | H |
| ethylene | methyl | methyl | — | — |
| ethylene | methyl | methyl | methyl | methyl |
| ethylene | ethyl | ethyl | H | H |
| ethylene | methyl | methyl | — | — |
| phenylene | H | H | methyl | methyl |
| phenylene | alkyl | alkyl | — | — |
| (CH₃)₂C⟨ | methyl | methyl | H | H |

| A' | $R^{19}$ | $R^{20}$ | $R^{21}$ | $R^{22}$ |
|---|---|---|---|---|
| $(CH_3)_2C\diagdown^{\diagup}$ | methyl | methyl | methyl | methyl |

If X and Y in formulae I and II are the —$NR^5$— group, or one of X or Y is —O— or —S— and the other is the $NR^5$— group, R and one of the radicals $R^5$ together can be alkylene of 5 to 7 carbon atoms to which the second —$NR^5$— group or —O— or —S— is bonded, or R is methylene, ethylene or propylene and both radicals $R^5$ of the $NR^5$— groups together are ethylene or propylene. The radicals thus defined are derived from heterocyclic diamines or aminoalcohols or aminothiols. Examples of such radicals are: 3-aminopyrrolidine, 3-hydroxypyrrolidine, imidazolidine, 3- or 4-aminopiperidine, 3- or 4-hydroxypiperidine and piperazine.

A preferred group of polycondensates are those in which X and Y in formulae I and II are the —$NR^5$— group and R and $R^4$ are radicals of the formulae

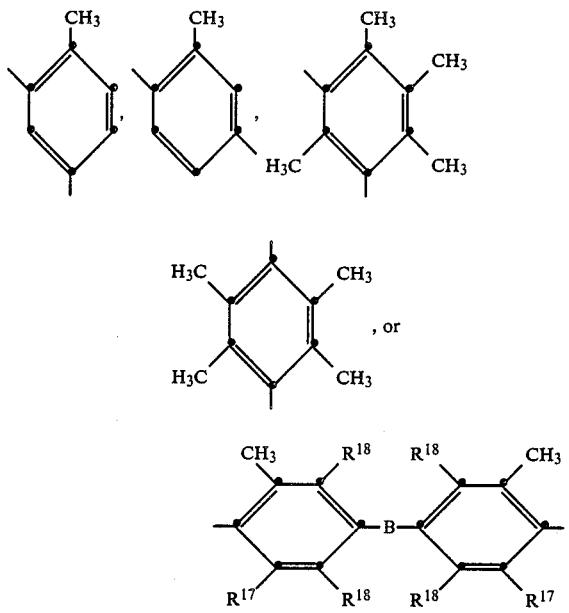

wherein B is an direct bond, —O— or preferably —$CH_2$—, and $R^{17}$ is ethyl or preferably methyl, or is branched alkylene of 6 to 20 carbon atoms which is preferably branched in the α-position to the —$NR^5$— group, and $R^{18}$ is a hydrogen atom, methyl or ethyl.

If X and Y in formulae I and II are oxygen atoms, in a preferred embodiment R or $R^4$ is branched or preferably linear alkylene of 2 to 20, in particular 2 to 12, carbon atoms, the divalent radical of a polyoxyalkylene containing 2 to 100 oxaalkylene units, for example —$(OCH_2CH_2O)_u$—, —$(OCHCH_2O)_u$— or
$\quad\quad\quad\quad\quad\quad\quad\quad\quad\;\;|$
$\quad\quad\quad\quad\quad\quad\quad\quad\quad CH_3$ —$(OCH_2CH_2CH_2O)_u$—, where u=2 to 100, cyclohexylene,

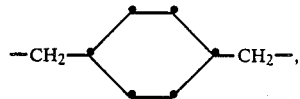

benzylene or a mononuclear or binuclear phenylene radical of the formula

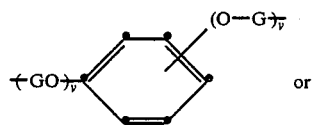

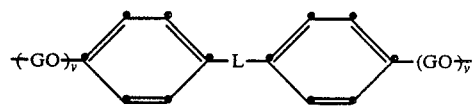

in which v is 0 or 1, L is a direct bond, —O—, —S—, —SO—, —$SO_2$—, CO, methylene, ethylidene, 1,1- or 2,2-propylidene, butylidene or cyclohexylidene and G is ethylene, 1,2-propylene or 2-hydroxy-1,3-propylene. The phenylene radicals can be substituted by alkyl or alkoxy of 1 to 4 carbon atoms or halogen, in particular Cl and Br.

$R^3$ is the divalent radical of a saturated organic dicarboxylic acid. The aliphatic radical can contain 2 to 40, preferably 2 to 20, carbon atoms, and most preferably 2 to 12 carbon atoms. $R^3$ may be e.g. a cycloaliphatic radical containing 5 to 7 ring carbon atoms or linear or branched alkylene of 2 to 12 carbon atoms. An aromatic radical $R^3$ preferably contains 6 to 18 carbon atoms and is preferably an aromatic hydrocarbon radical.

Suitable aliphatic dicarboxylic acids are those containing 2 to 40 carbon atoms, for example oxalic acid, malonic acid, dimethylmalonic acid, succinic acid, pimelic acid, adipic acid, trimethyladipic acid, sebacic acid, azelaic acid and hydrogenated dimeric acids (dimerisation products of unsaturated aliphatic carboxylic acids such as oleic acid), and alkylated malonic and succinic acids, such as octadecylsuccinic acid.

Suitable cycloaliphatic dicarboxylic acids are: 1,3-cyclobutanedicarboxylic acid, 1,3-cyclopentanedicarboxylic acid, 1,3- and 1,4-cyclohexanedicarboxylic acid, 1,3- and 1,4-(dicarboxymethyl)cyclohexane and 4,4'-dicyclohexyldicarboxylic acid.

Suitable aromatic dicarboxylic acids are: terephthalic acid, isophthalic acid, o-phthalic acid, 1,3-, 1,4-, 2,6- or 2,7-naphthalenedicarboxylic acid, 4,4'-diphenyldicarboxylic acid, 4,4'-diphenylsulfonecarboxylic acid, 1,1,3-trimethyl-5-carboxy-3-(p-carboxyphenyl)indane, 4,4'-diphenyl etherdicarboxylic acid, bis-p-(carboxyphenyl)methane and tetrabromoterephthalic acid.

Aromatic and cycloaliphatic orthodicarboxylic acids and glutaric acids, and succinic acids are less suitable for polyamides, since they tend to form imides under the influence of primary amines.

Aromatic dicarboxylic acids are preferred, among them in particular terephthalic acid and isophthalic acid and dicarboxylic acids of the formula

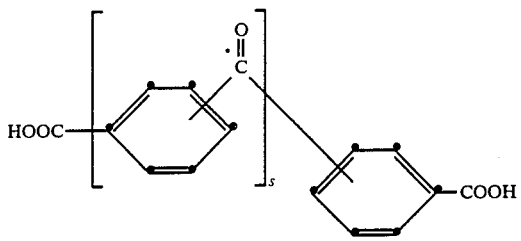

wherein s is 1 to 6.

In a particularly preferred embodiment, the polycondensates of the invention contain structural units of the formula

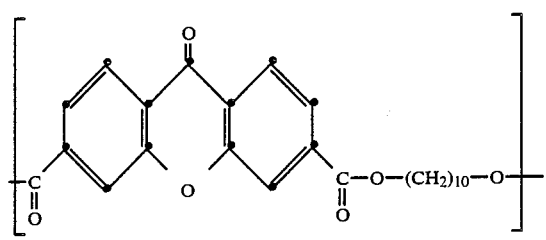

The polycondensates eligible for use in the practice of this invention can have average molecular weights ($\overline{M}w$) of not less than 2000, preferably of not less than 5000. The upper limit depends essentially on the desired properties such as ease of processing or their solubility, and can be up to 500,000, preferably up to 100,000 and, most preferably, up to 50,000. The polycondensates can furthermore be random polymers or block polymers. They are prepared by conventional methods in apparatus envisaged for the purpose. The polymers are preferably linear in structure but may be branched to a minor extent with at least trifunctional monomers such as triamines, trioles or tetroles, which are added in small amounts.

A further object of the invention is a process for the preparation of polycondensates containing structural units of formulae I and/or II, which process comprises polycondensing dicarboxylic acids of formula IV

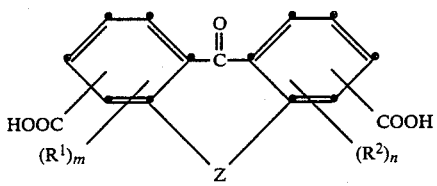

wherein Z, $R^1$, $R^2$, m and n have the given meanings, or mixtures of these acids, in an amount of at least 10 mol.%, based on the polycondensate, optionally together with a dicarboxylic acid of formula

HOOC—$R^3$—COOH (V)

or the polyester or polyamide forming derivatives thereof with a diol, dimercaptan, a diamine, an amino alcohol, an amino mercaptan, a hydroxymercaptan of formula VI or with mixtures of these monomers

HX—R—YH (VI)

wherein R, $R^3$ and $R^5$ have the given meanings and X and Y are either —O—, —S— or —$NHR^5$— or X is —O— or —S— and Y is —$NHR^5$—.

Some of the dicarboxylic acids of formula IV are known. Anthraquinonedicarboxylic acids are described e.g. by N. K. Moshchinskaya, V. V. Kutsygina, L. I. Kovalevskaya et al., Ukr. Khim. Zh. (Russian ed.) 46 (1), 77-80 (1980).

Hydrogenation of the keto groups in anthraquinonedicarboxylic acids with e.g. $NaBH_4$ gives the corresponding dihydroxy compound, which can be converted into anthronedicarboxylic acid by treatment with hydrochloric acid under reflux. The $CH_2$ group of the anthronedicarboxylic acid can be alkylated in known manner and thus converted into a compound of formula IV, in which Z is —$CR^6R^7$—, where $R^6$ and $R^7$ have the given meanings.

Fluorenonedicarboxylic acid can be prepared e.g. by dimerising methylphenylmagnesium bromide in the presence of $CuCl_2$ and reacting the resultant dimethylbiphenyl with $COCl_2$, in the presence of $AlCl_3$, to the dimethylfluorenone, which can be oxidised in known manner, e.g. with $NHO_3$ to the dicarboxylic acid.

Xanthonedicarboxylic acid is obtained by first reacting dimethylphenyl ether with $CCl_4$, in the presence of $AlCl_3$, and subsequently hydrolysing the reaction product with dilute HCl to dimethylxanthone, which is oxidised in known manner, e.g. with $HNO_3$ to the dicarboxylic acid.

Dicarboxylic acids containing structural units of formula IV, wherein Z is S, $SO_2$ or NR, can be obtained in the following manner: bromotoluene is reacted with $CCl_4$, in the presence of $AlCl_3$, to bis(bromotoluyl)dichloromethane. Oxidation with 20% $NHO_3$ gives

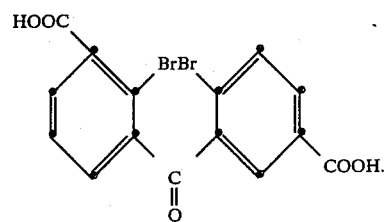

Reaction with $Na_2S$ gives the thioxanthonedicarboxylic acid, which can be oxidised in known manner to the sulfoxide or sulfone. Reaction with or $RNH_2$ gives the acridonedicarboxylic acid.

The invention further relates to dicarboxylic acids of formula

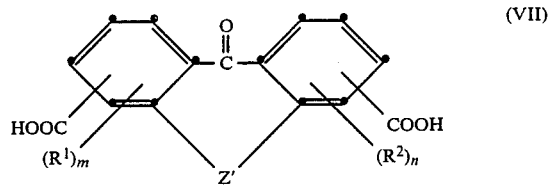

wherein Z' is a direct bond, —$CH_2$—, —O—, —S—, —SO—, —$NR^6$— or —$CR^6R^7$—, where $R^6$ is a hydrogen atom, $C_1$-$C_{10}$alkyl, phenyl, naphthyl or phenyl(-$C_aH_{2a}$), where a is 1 to 4 and $R^7$ has the meaning of $R^6$ but is not a hydrogen atom, $R^1$ and $R^2$ are each independently of the other $C_1$-$C_{10}$alkyl, halogen, —CN, —$NO_2$, $C_1$–$C_{12}$alkoxy, phenoxy, naphthoxy or phenyl($C_aH_{2a}$), where a is 1 to 4 and m and n are each independently 0, 1, 2 or 3, as well as the acid derivatives.

Examples of acid derivatives are the anhydrides, esters, amides and halides, in particular chlorides.

Preferred dicarboxylic acids of formula VII are those in which the free bonds are located meta and para to the CO group, m and n are 0 and Z' is a direct bond, —$CH_2$—, —O— or —S—.

Examples of suitable polyamide- or polyester-forming derivatives are acid anhydrides, acid amides, acid halides and acid esters. Examples of suitable preparatory processes are solvent polycondensation, melt condensation and interfacial polycondensation. Suitable solvents are mentioned below.

The reaction temperatures essentially depend on the starting materials or their reactivity. They can be in the range from −50° to 350° C., preferably from 50° to 300° C. The polycondensation can furthermore be carried out under normal pressure or reduced pressure. The water, alcohol or amine formed during the condensation is conveniently removed from the reaction mixture during the process, or hydrogen halides formed, for example HCl or HBr, are bound by addition of suitable agents, such as tertiary amines or epoxides.

Polyesters are likewise advantageously prepared in two stages by carrying out an esterification or transesterification with the diol or dimercaptan in a first stage and then continuing the polycondensation, preferably in the melt, with removal of the excess diol or mercaptan formed, until the desired viscosity is reached.

The polycondensates of the invention are polymers which can be crosslinked direct by applying irradiation. They are suitable for making moulded articles, sheets, filaments and for coating substrates, for protective insulation or for producing relief images, for which ultities the properties of the polycondensates can be modified by irradiation. Some of the polycondensates are thermoplastics which can be processed by the methods conventionally employed for this class of polymers. The high-melting, in particular fully aromatic, polycondensates are preferably processed from their solution.

A preferred field of application is the use of the material of this invention for providing protective coatings and relief images on such coated substrates. Such utility constitutes a further object of the invention. It is especially advantageous that, for the attainment of desired properties, the polycondensates of this invention can be adapted for specific requirements regarding their use by the choice of different monomers and/or by mixing them with different polycondensates.

To produce the coated material of this invention, a polycondensate or a mixture thereof is advantageously dissolved in a suitable organic solvent, with or without the application of heat. Examples of suitable solvents are polar, aprotic solvents which can be used by themselves or in mixtures of at least two solvents. Examples are: ethers such as dibutyl ether, tetrahydrofuran, dioxane, methylene glycol, dimethylethylene glycol, dimethyldiethylene glycol, diethyldiethylene glycol and dimethyltriethylene glycol; halogenated hydrocarbons such as methylene chloride, chloroform, 1,2-dichloroethane, 1,1,1-trichloroethane and 1,1,2,2-tetrachloroethane; carboxylic acid esters and lactones such as ethyl acetate, methyl propionate, ethyl benzoate, 2-methoxyethyl acetate, γ-butyrolactone, o-valerolactone and pivalolacetone; carboxamides and lactams such as formamide, acetamide, N-methylformamide, N,N-dimethylformamide, N,N-diethylformamide, N,N-dimethylacetamide, N,N-diethylacetamide, γ-butyrolactam, ε-caprolactam, N-methylpyrrolidone, N-acetylpyrrolidone, N-methylcaprolactam, tetramethylurea and hexamethylphosphoric triamide; sulfoxides such as dimethylsulfoxide; sulfones such as dimethyl sulfone, diethyl sulfone, trimethylene sulfone and tetramethylene sulfone; trimethylamine, triethylamine, N-methylpyrrolidine, N-methylpiperidine, N-methylmorpholine and substituted benzenes such as chlorobenzene, nitrobenzene, phenols or cresol.

Undissolved constituents can be removed by filtration, preferably by present filtration. The concentration of polymer in the coating agent thus obtained is preferably not more than 50% by weight, in particular not more than 30% by weight and most preferably not more than 20% by weight, based on the solution. The solutions are storage stable.

Other customary modifiers which do not adversely affect the photosensitivity can be incorporated during the preparation of the solutions. Examples of such modifiers are delustering agents, flow control agents, finely particulate fillers, flameproofing agents, fluorescent whitening agents antioxidants, light stabilisers, stabilisers, dyes, pigments and adhesion promoters. If desired, sensitisers such as thioxanthone derivatives or benzophenone derivatives may also be incorporated in order to increase the photosensitivity still further.

The coating agent can be applied to suitable substrates by conventional methods such as immersion, brushing and spraying methods and whirl coating, cascade coating and curtain coating. Examples of suitable substrates are plastics, metals and metal alloys, semimetals, semiconductors, glass, ceramics and other inorganic materials, for example $SiO_2$ and $Si_3N_4$. After coating, the solvent is removed, if necessary by warming and if necessary in vacuo. Nontacky, dry, uniform films are obtained. The films can have, coating thicknesses of up to about 500 μm or more, preferably of 0.5 to 500 μm and in particular of 1 to 50 μm, depending on their use.

The radiation-sensitive coating of the material of this invention can be crosslinked by applying irradiation.

The photostructuring or photocrosslinking can be effected by high-energy radiation, for example by light, in particular in the UV range, by X-rays, laser light, electron beams and the like. The material of this invention is admirably suitable for producing protective films and passivating lacquers and as a photographic recording material for heat-stable relief images.

This utility also constitutes an object of the invention. Examples of fields of use are protective, insulating and passivating lacquers in electrotechnology and electronics, photomasks for electronics, textile printing and the graphics industry, etch resists for the production of printed circuits and printing plates and integrated circuits, relays for the production of X-ray masks, solder-stopping lacquers, dielectrics for multilayer circuits and structural elements for liquid crystal displays.

Protective films are produced by direct exposure, the exposure times essentially depending on the coating thicknesses and the photosensitivity.

Photographic production of the relief structure is effected by image-wise exposure through a photomask, and subsequent development with a solvent or a solvent mixture while removing the unexposed areas, after which the image produced may be stabilised by an optional thermal after-treatment.

Such a process for producing relief structures constitutes yet a further object of the invention. Suitable developers are e.g. the solvents indicated above.

The polymer layer of the material according to the invention has a photosensitivity which is sufficient for many application purposes and in some cases is high, and it can be photocrosslinked direct. The protective films and relief images have good adhesion and heat, mechanical and chemical stability. Only minor shrinkage is observed during after-treatment with heat. Furthermore, additives for producing or increasing photosensitivity can be avoided. The material is storage stable but should be protected from the action of light.

The following Examples illustrate the invention in more detail.

A. Preparation of the starting materials

EXAMPLE 1

Diphenyl thioxanthone-10,10-dioxide-2,6-dicarboxylate (a) Thioxanthone-10,10-dioxide-2,6-dicarboxylic acid 56 g of 2-methylthioxanthone-6-carboxylic acid are suspended in 600 ml of 20% nitric acid and the suspension is heated for 24 hours in an autoclave to 180° C. The reaction product is isolated by filtration, washed with water and dried.

Elemental analysis: theory: C 54.22%, H 2.43%, O 33.71%, S 9.65%. found: C 54.2% H 2.6%, O 33.1%, S 9.5%.

(b) Thioxanthone-10,10-dioxide-2,6-dicarboxylic acid dichloride

A suspension of 38 g of the dicarboxylic acid obtained in (a) are refluxed for 5 hours in 200 ml of thionyl chloride and 1 ml of dimethylformamide. Excess thionyl chloride is then evaporated off and the residue is recrystallised twice from toluene. Yield: 28 g. Mass spectrum: m/e=368 (5%, M+) and 333 (100%, M+-Cl).

(c) Diphenyl thioxanthone-10,10-dioxide-2,6-dicarboxylate 30 ml of triethylamine are added dropwise to a mixture, which has been cooled in an ice bath, of 28 g of the acid chloride obtained in (b) and 23 g of phenol in 200 ml of chloroform. The mixture is stirred for 20 hours and, after dilution with another 200 ml of chloroform, washed with sodium carbonate solution. The solvent is removed by distillation and the residue is recrystallised from chloroform. Yield: 30.9 g. Melting point: 228°–230° C.

Elemental analysis: theory: C 66.94%, H 3.33%, O 23.12%, S 6.62%. found: C 67.2%, H 3.5%, O 22.6%, S 6.7%.

EXAMPLE 2

Diphenyl xanthone-3,6-dicarboxylate 15.7 g of 3,6-dimethylxanthone (J. B. Chazan and G. Ourisson, Bull. Soc. Chim. France 1968, 1384) are suspended in 450 ml of 20% nitric acid and the suspension is heated for 20 hours to 180° C. After cooling, filtration, washing with water and drying, 12.7 g of xanthone-3,6-dicarboxylic acid are obtained.

A mixture of 12.5 g of dicarboxylic acid, 120 ml of thionyl chloride and 1 ml of dimethylformamide is heated for 2½ hours under reflux. All volatile constituents are then distilled off and the residue is dried in vacuo. The product is then suspended in 250 ml of chloroform and the suspension is cooled in an ice bath. After addition of 16 g of phenol, 20 g of triethylamine are added dropwise over 1½ hours and the mixture is stirred for 16 hours at room temperature. The solution is concentrated to 150 ml and filtered.

The filter residue is recrystallised from toluene, affording 7 g of diphenyl xanthone-3,6-dicarboxylate with a melting point of 241°–242° C.

Elemental analysis: theory: C 74.31%, H 3.70%, O 22.0%. found: C 74.2%, H 4.0%, O 21.6%.

B. Preparation of the polymers

The reduced viscosity of the polyamides and polyesters ($\eta_{red}$) is determined in a 0.5% soluion in m-cresol at 25° C. and the glass transition temperature ($T_g$) or the melt temperature ($T_m$) is measured in a differential scanning calorimeter (DSC).

EXAMPLE 3

With stirring, a mixture of 4.42 g of 1,6-decanediol (0.025 mole) and 2.77 g (0.0064 mole) of diphenyl xanthone-3,6-dicarboxylate is heated, in the presence of c. 2.5 mg of titanium tetraisopropylate as catalyst, to 220° C. in an inert gas atmosphere. After 4 hours the pressure is reduced from normal pressure to below 0.1 torr and the melt is further stirred for 1½ hours. The melt solidifies upon subsequent cooling.

$\eta_{red}$: 0.20 dl/g, $T_m$: 88° C. ($\Delta H=37$ J/g).

EXAMPLE 4

A mixture of 1.55 g (0.006 mole) of 1-isopropyl-10,10-dimethyl-1,11-diaminoundecane and 2.92 g (0.006 mole) of diphenyl thioxanthone-10,10-dioxide-2,6-dicarboxylate in 10 g of phenol, as solvent, is heated to 190° C. in an inert gas atmosphere and stirred for 2½ hours at this temperature. Then the temperature is raised to 220° C. and stirring is continued for 6 hours. After the batch has cooled, the polyamide is precipitated by pouring the reaction mixture into alcohol and isolated.

$\eta_{red}$: 0.14 dl/g, $T_g$: 90° C.

EXAMPLE 5

In a cylindrical stirred reactor equipped with stirrer, dropping funnel, thermometer, gas inlet and gas outlet pipe, 0.01 mole of 3,3',5,5'-tetramethyl-4,4'-diaminodiphenylmethane and 0.01 mole of 2,4-diamino-3,5-diethyltoluene in 35 ml of N-methylpyrrolidone are cooled to −15° C. under nitrogen. To the solution are then added 6.67 g (0.02 mole) of anthraquinone-2,6(2,7)-dicarboxylic acid dichloride. The cooling is removed after 5 minutes and the solution is stirred for 5 hours. After addition of 0.8 ml of propylene oxide stirring is continued for 1 hour. The polyamide is isolated by precipitation with 500 ml of water in a domestic mixer, filtering, washing with water and drying in vacuo at 80° C. $T_g$: 300° C.

C. Application Example (production of a relief image)

A thin polymer film is produced on a copper-clad plastic plate by whirl-coating a 5% polymer solution thereon and subsequently removing the solvent in a circulating air oven. The solvent employed is usually N-methylpyrrolidone.

The coated plate is exposed through a photomask at room temperature with a 1000 watt UV lamp from a distance of 18 cm. The exposed plate is then developed with a solvent and the unexposed areas of the polymer film are dissolved out (developer: mixture of γ-butyrolactone and propyone glycol carbonate). The relief image is then made visible by etching away the exposed copper layer with $FeCl_3$ solution.

The exposure times for obtaining a complete image on the polymer films described in Examples 3-5 are:

| Example | 3 | 4 | 5 |
| --- | --- | --- | --- |
| seconds | 60 | 240 | 120 |

What is claimed is:

1. A radiation-sensitive linear saturated homo- or polycondensate selected from the group of polyesters, polyamides and polyester amides and containing at least one recurring structural unit of formula I

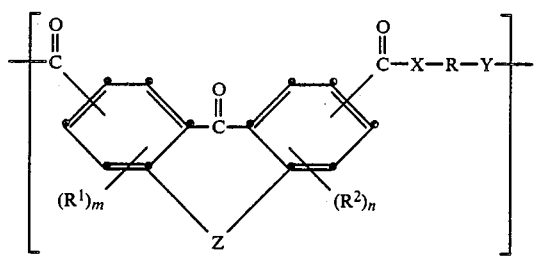

and, in the case of a copolycondensate, also recurring structural units of formula II

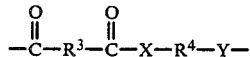

wherein
m and n are each independently of the other an integer from 0 to 3,
X and Y are each independently of the other —S—, —O— or —NR$^5$—,
Z is a direct bond, —CH$_2$—, —O—, —S—, —SO—, —SO$_2$—, —CO—, —NR$^6$— or —CR$^6$R$^7$, where R$^6$ is a hydrogen atom, C$_1$-C$_{10}$alkyl, phenyl, naphthyl or phenyl(C$_a$H$_{2a}$), where a is 2 to 4, and R$^7$ has the same meaning as R$^6$ but is not a hydrogen atom,
R$^1$ and R$^2$ are each independently of the other C$_1$-C$_{10}$alkyl, halogen, —CN, —NO$_2$, C$_1$-C$_{12}$alkoxy, phenoxy, naphthoxy or phenyl(C$_a$H$_{2a}$), wherein a is 1 to 4,
R is an unsubstituted or substituted divalent aliphatic, cycloaliphatic, araliphatic or aromatic radical, and, if X and Y are the —NR$^5$— group, R and one of R$^5$, when taken together, are C$_5$-C$_7$alkylene to which the second —NR$^5$— group is attached, or R is methylene, ethylene or propylene, and both radicals R$^5$ of the —NR$_5$— group, when taken together, are ethylene or propylene or, if one of X or Y is —S— or —O— and the other is —NR$^5$—, R and R$^5$ together are C$_5$-C$_7$-alkylene,
R$^4$ has independently the same meaning as R,
R$^3$ is a divalent saturated aliphatic or aromatic radical, and
R$^5$ is a hydrogen atom, alkyl, cycloalkyl, aryl, aralkyl or alkaralkyl,
said copolycondensate containing at least 10 mol.% of the structural units of formula I, based on the copolycondensate.

2. A polycondensate according to claim 1, which contains at least 50 mol.%, in particular at least 70 mol.% and, most preferably, at least 90 mol.%, of the structural units of formula I.

3. A polycondensate according to claim 1, wherein R$^5$ is C$_1$-C$_6$alkyl, phenyl or benzyl, or preferably a hydrogen atom.

4. A polycondensate according to claim 1, wherein the carbonyl groups in the structural unit of formula I are preferably located meta and, most preferably, para to the carbonyl group in the ring.

5. A polycondensate according to claim 1, wherein R or R$^4$ contains 2 to 30 carbon atoms as an aliphatic radical, 5 to 8 ring carbon atomsd as a cycloaliphatic radical, 7 to 30 carbon atoms as an araliphatic radical, and 6 to 30 carbon atoms as an aromatic radical.

6. A polycondensate according to claim 1, wherein X and Y in formulae I and II are the —NR$^5$— group and the aliphatic or araliphatic radical contains 6 to 22 carbon atoms, or X and Y in formulae I and II are —O— and the aliphatic radical contains 2 to 12 carbon atoms.

7. A polycondensate according to claim 1, wherein an aliphatic radical R or R$^4$ is linear or branched alkylene which can be interrupted by oxygen atoms, NH, NR$^a$ or ⊕NR$_2^a$G⊖, in which R$^a$ is alkyl of 1 to 12 carbon atoms, cycloalkyl containing 5 or 6 ring carbon atoms, phenyl or benzyl and G⊖ is the anion of a protic acid, or by cyclohexylene, naphthylene, phenylene or a hydantoin; a cycloaliphatic radical R or R$^4$ is monocyclic or bicyclic cycloalkylene which has 5 to 7 ring carbon atoms and is unsubstituted or substituted by alkyl, an araliphatic radical R or R$^4$ is aralkylene which is unsubstituted or substituted on the aryl by alkyl, the alkylene radical being linear or branched, or an aromatic radical R or R$^4$ is a hydrocarbon radical or a pyridine radical which is substituted by alkyl, alkoxy, alkoxyalkyl, trimethylene or tetramethylene.

8. A polycondensate according to claim 7, wherein an aliphatic radical R or R$^4$ is linear or branched alkylene of 2 to 30 carbon atoms, —(CH$_2$)$_x$—R$^8$—(CH$_2$)$_y$—, in which R$^8$ is phenylene, naphthylene, cyclopentylene or cyclohexylene and x and y are each independently of the other 1, 2 or 3, —R$^9$—(OR$^{10}$)$_p$—O—R$^9$—, in which R$^9$ is ethylene, 1,2-propylene, 1,3-propylene or 2-methyl-1,3-propylene, R$^{10}$ is ethylene, 1,2-propylene, 1,2-butylene, 1,3-propylene or 1,4-butylene and p is an integer from 1 to 100, or

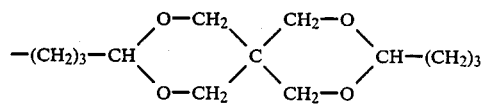

9. A polycondensate according to claim 7, wherein a cycloaliphatic radical R or R$^4$ is a radical of the formula

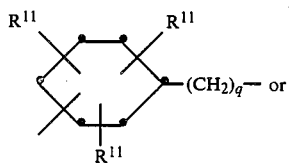

-continued

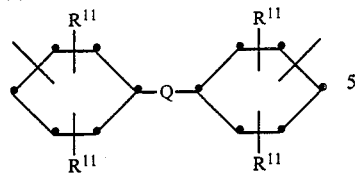

in which q is 0 or 1, each $R^{11}$ is independently hydrogen or alkyl of 1 to 6 carbon atoms and Q is a direct bond, O, S, $SO_2$, alkylene of 1 to 3 carbon atoms or alkylidene of 2 to 6 carbon atoms.

10. A polycondensate according to claim 7, wherein an aromatic radical R or $R^4$ is substituted by alkyl, alkoxy or alkoxyalkyl, each of 1 to 6 carbon atoms, or two adjacent carbon atoms of the aromatic radical are substituted by trimethylene or tetramethylene.

11. A polycondensate according to claim 10, wherein X and Y in formulae I and II are the —$NR^5$— group and one or two of the substituents are located ortho to the —$NR^5$— group.

12. A polycondensate according to claim 7, wherein the araliphatic radical has the formula

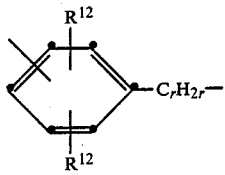

wherein each $R^{12}$ independently is a hydrogen atom or $C_1$-$C_6$alkyl and each r is an integer from 1 to 16.

13. A polycondensate according to claim 12, wherein the free bond is in the para-position to the $C_rH_{2r}$ group and one $R^{12}$ or each $R^{12}$ as alkyl is in the ortho-position to the free bond.

14. A polycondensate according to claim 7, wherein the aromatic radical has the formula

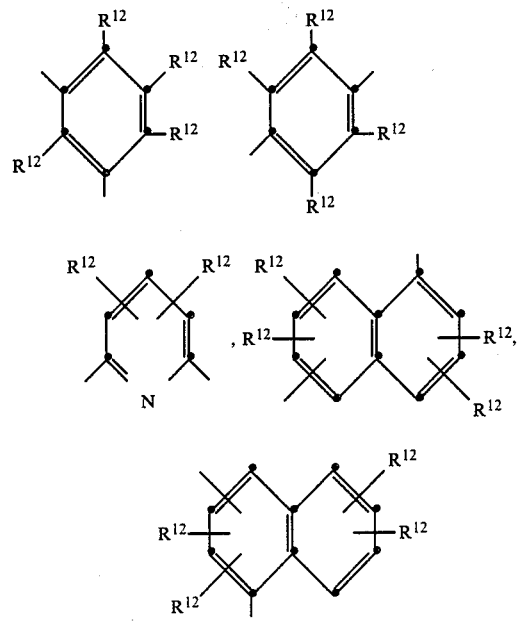

-continued

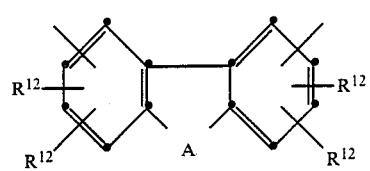

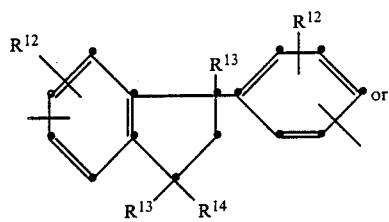

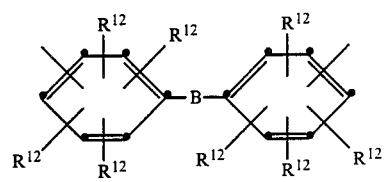

wherein each $R^{12}$ is a hydrogen atom and, in the case of monosubstitution, one substituent $R^{12}$ is alkyl of 1 to 6 carbon atoms and the other substituents $R^{12}$ are hydrogen atoms, and in the case of di-, tri- or tetra-substitution, two substituents $R^{12}$ are alkyl of 1 to 6 carbon atoms and the other substituents $R^{12}$ are hydrogen atoms or alkyl of 1 to 6 carbon atoms, or in the case of di-, tri- or tetra-substitution, two vicinal substituents $R^{12}$ in the phenyl ring are trimethylene or tetramethylene and the other substituents $R^{12}$ are hydrogen atoms or alkyl of 1 to 6 carbon atoms, A is O, S, NH, CO or $CH_2$, $R^{13}$ is a hydrogen atom or alkyl of 1 to 5 carbon atoms, $R^{14}$ is alkyl of 1 to 5 carbon atoms and B is a direct bond, O, S, SO, $SO_2$, CO,

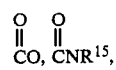

$NR^{15}$, CONH, NH, $R^{15}SiR^{16}$, $R^{15}OSiOR^{16}$, alkylene of 1 to 6 carbon atoms, alkenylene or alkylidene of 2 to 6 carbon atoms, phenylene or phenyldioxyl, in which $R^{15}$ and $R^{16}$ are each independently of the other alkyl of 1 to 6 carbon atoms or phenyl.

15. A polycondensate according to claim 14, wherein the aromatic radical has the formula

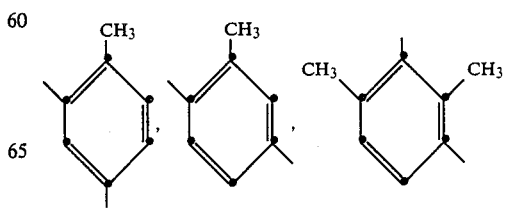

-continued

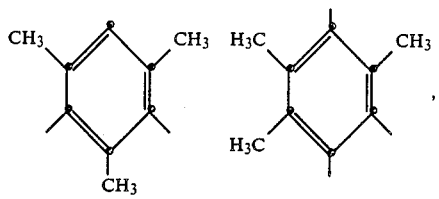

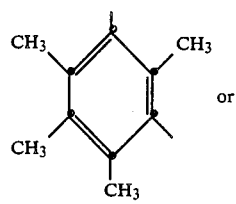 or

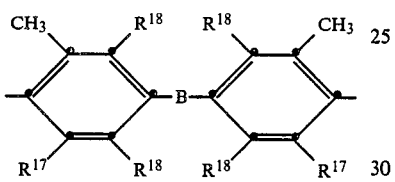

wherein B is a direct bond, O and, preferably, CH$_2$, R$^{17}$ and R$^{18}$ are each independently of the other a hydrogen atom or methyl or ethyl.

16. A polycondensate according to claim 1, wherein X and Y in formulae I and II are the —NR$^5$— group and R or R$^4$ are a radical as defined in claim 15, wherein R$^{17}$ is methyl or ethyl and R$^{18}$ is hydrogen, methyl or ethyl; or X and Y in formulae I and II are branched alkylene of 6 to 20 carbon atoms which is preferably branched in the α-position to the —NR$^5$— group.

17. A polycondensate according to claim 1, wherein R$^3$ in formula II is linear or branched alkylene of 2 to 12 carbon atoms, cycloalkylene containing 5 to 7 ring carbon atoms or an aromatic hydrocarbon radical of 6 to 18 carbon atoms.

18. A polycondensate according to claim 17, wherein R$^3$ in formula II is a structural unit of formula III

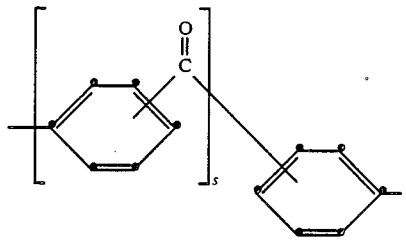 (III)

wherein s is 1 to 6.

19. A polycondensate according to claim 1, wherein Z in formula I is —CO—, —SO$_2$— or —O—.

20. A polycondensate according to claim 1, which contains the structural unit of the formula

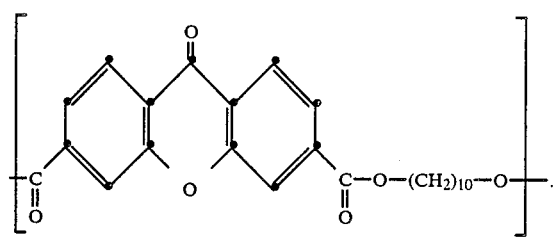

21. A process for the preparation of a polycondensate according to claim 1, which comprises polycondensing a dicarboxylic acid of formula IV

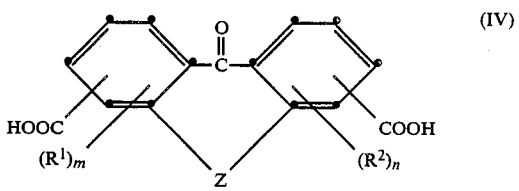 (IV)

wherein Z, R$^1$, R$^2$, m and n have the given meanings, or a mixture of such acids, in an amount of at least 10 mol. %, based on the polycondensate, optionally together with a dicarboxylic acid of formula V

HOOC—R$^3$—COOH   (V)

or a polyester or polyamide forming derivative thereof with a diol, dimercaptan, a diamine, an amino alcohol, an amino mercaptan, a hydroxymercaptan of formula VI or with a mixture of said monomers

HX—R—YH   (VI)

wherein X and Y are either —O—, —S— or NR$^5$— or X is —O— or —S— and Y is —NR$^5$—, and R, R$^3$ and R$^5$ have the given meanings.

22. A coated material which contains on at least one surface of a substrate a layer of a polycondensate according to claim 1.

* * * * *